United States Patent [19]
Strohmaier

[11] Patent Number: 5,816,798
[45] Date of Patent: Oct. 6, 1998

[54] CONVEYING APPARATUS AND CONTINUOUS FURNACE EQUIPPED THEREWITH

[75] Inventor: Erich Strohmaier, Suberg, Switzerland

[73] Assignee: Lükon Paul Lüscher Werke AG, Täuffelen, Switzerland

[21] Appl. No.: 855,196

[22] Filed: May 13, 1997

[30] Foreign Application Priority Data

May 14, 1996 [DE] Germany ............... 196 19 486.5

[51] Int. Cl.$^6$ ............... F27B 9/00; F27D 3/00
[52] U.S. Cl. ............... 432/121; 432/122; 432/5; 432/6; 198/775; 414/156; 414/198
[58] Field of Search ............... 198/775, 774.3, 198/621.3, 774.1, 777; 414/153, 156, 173, 198; 187/213, 414; 432/121, 122, 5, 6

[56] References Cited

U.S. PATENT DOCUMENTS

| 261,715 | 7/1882 | Hopkins ............... 198/777 |
| 1,422,816 | 7/1922 | Beers et al. ............... 198/775 |
| 2,325,889 | 6/1943 | Thompson et al. ............... 198/775 |

FOREIGN PATENT DOCUMENTS

| 0 703 423 | 3/1996 | European Pat. Off. . |
| 272 054 | 9/1989 | German Dem. Rep. . |
| 273 045 | 11/1989 | German Dem. Rep. . |
| 1 506 769 | 8/1969 | Germany . |
| 2 237 121 | 2/1974 | Germany . |
| 31 34 097 | 4/1982 | Germany . |
| 1 276 562 | 6/1972 | United Kingdom . |

Primary Examiner—Teresa J. Walberg
Assistant Examiner—Jiping Lu
Attorney, Agent, or Firm—Graham & James LLP

[57] ABSTRACT

A conveying apparatus for a continuous furnace comprises at least one conveying-beam pair and at least one retaining-beam pair, which are located opposite one another in each case with the conveyable object between them, and which makes it possible to choose virtually any conveying direction, in particular a vertical one. By guiding the conveying beams in opposite directions along suitable curved paths, it may be ensured that abrasive contact does not occur between the objects which are to be conveyed and the retaining beams, on the one hand, and the conveying beams, on the other hand. The avoidance of abrasive contact means that there is virtually no wear during the transportation of the objects which are to be conveyed, with the result that it is possible to maintain clean conditions, as are frequently required in the electronics and semiconductor industry.

20 Claims, 15 Drawing Sheets

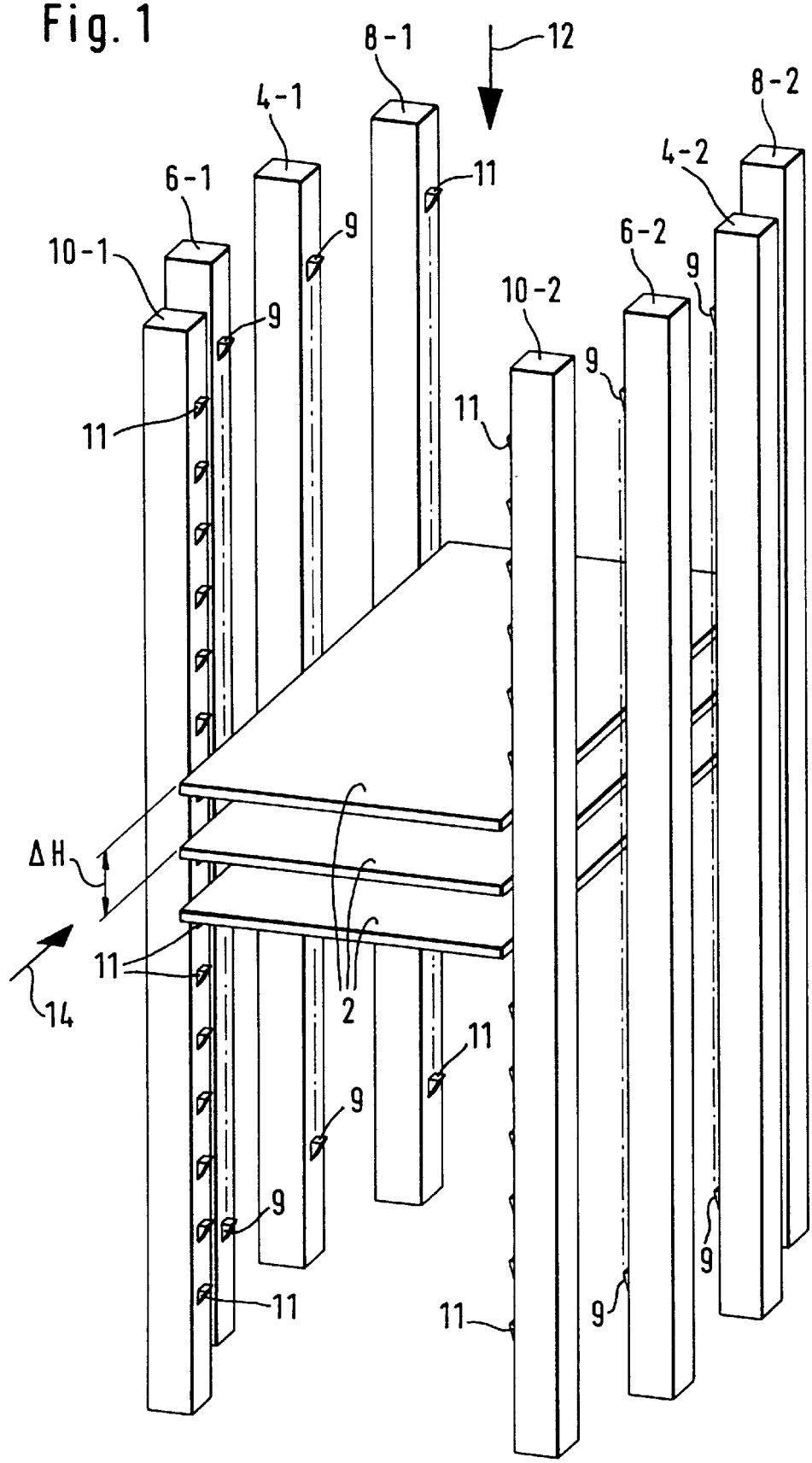

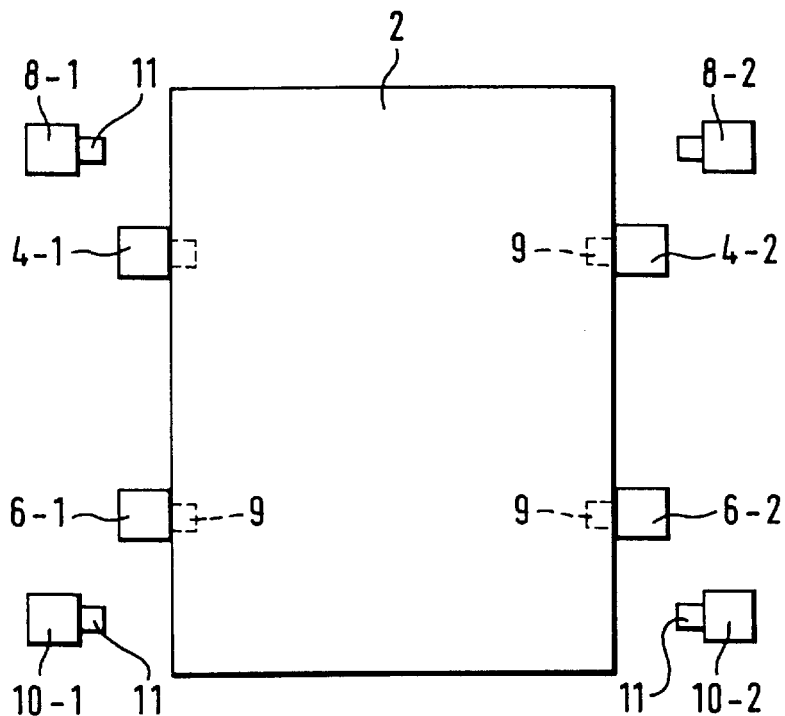
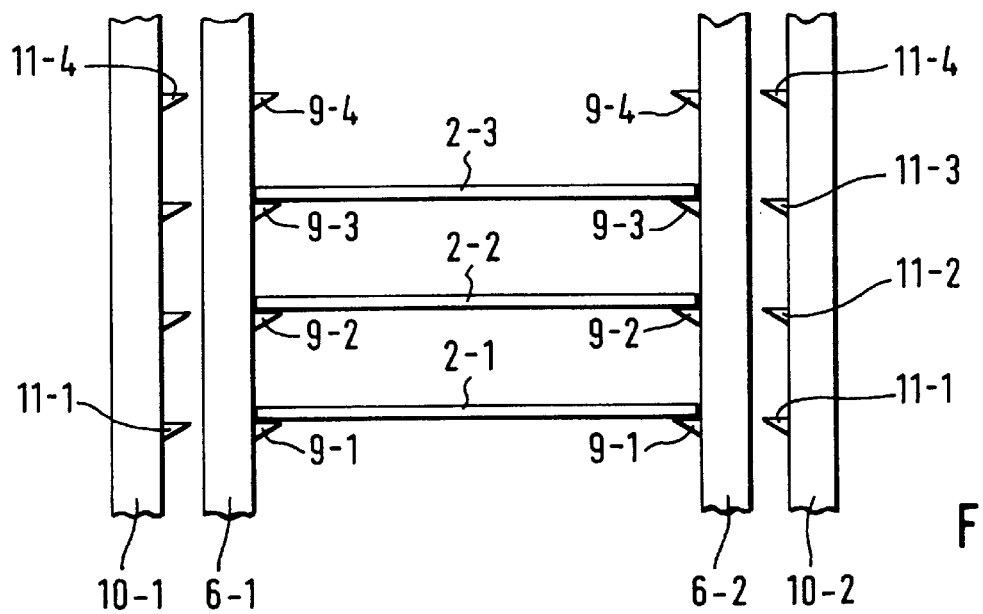
Fig. 2a
Fig. 2b

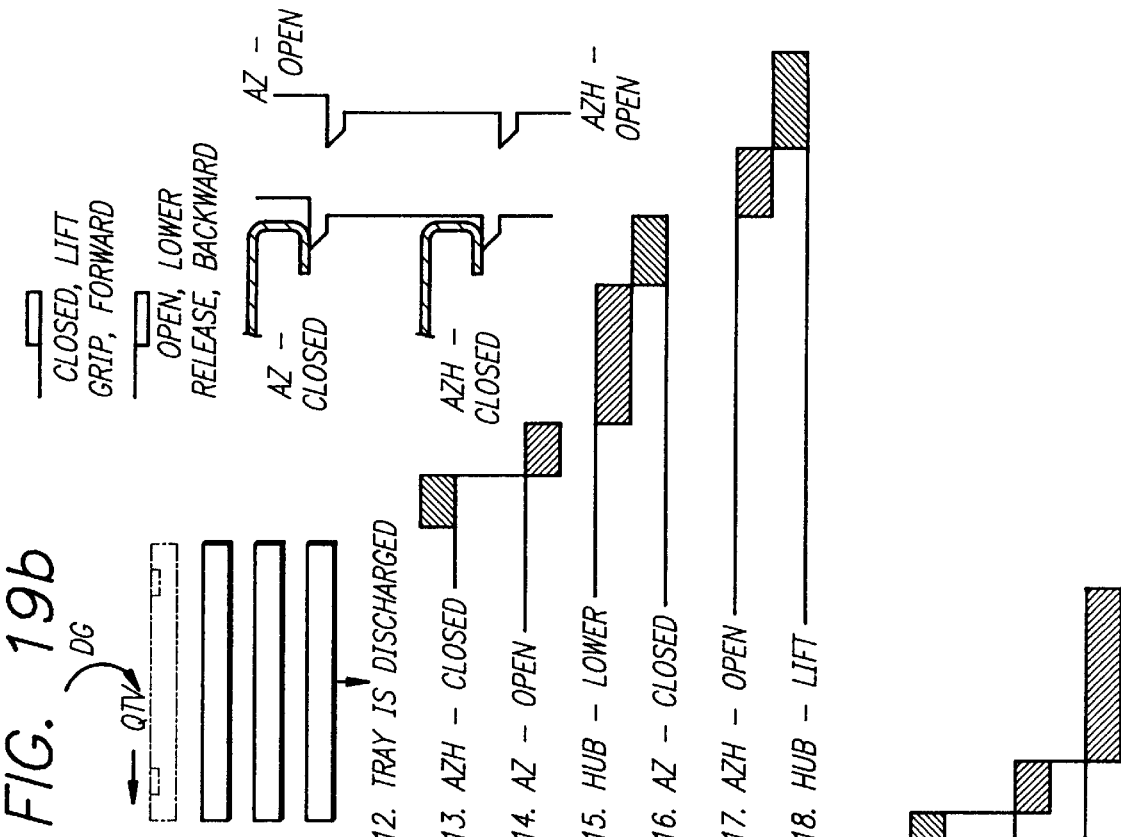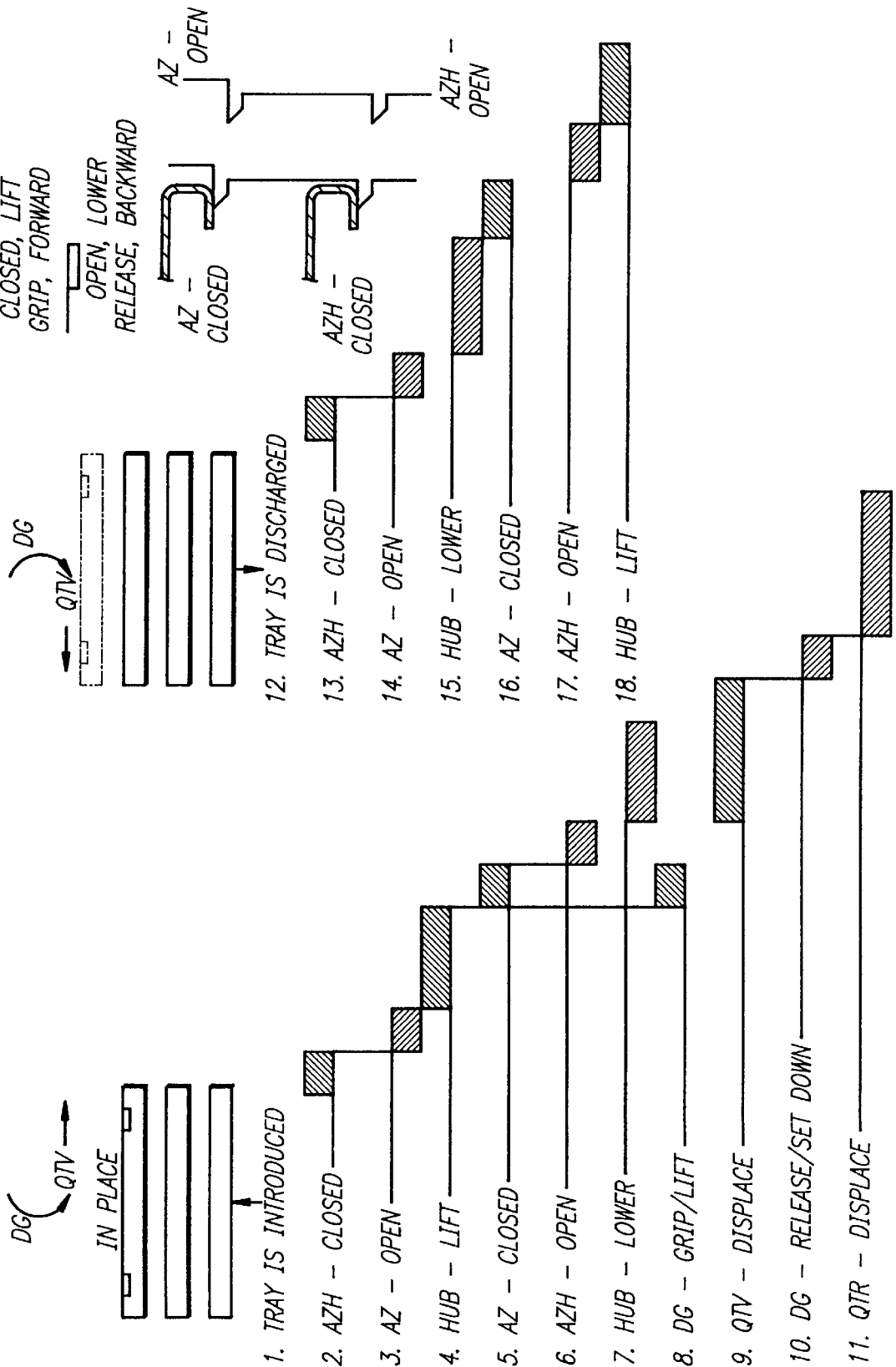

CONVEYING APPARATUS AND CONTINUOUS FURNACE EQUIPPED THEREWITH

DESCRIPTION

The invention relates to a conveying apparatus, in particular for continuous furnaces, and to a continuous furnace equipped therewith.

German Offenlegungsschrift 22 37 121, for example, discloses a walking-beam conveyor, in particular for a continuous furnace, by means of which elongate objects which are to be conveyed are moved horizontally through the continuous furnace transversely to the conveying direction. The interior of the continuous furnace, or of the conveying apparatus, is provided in this case, in the horizontal direction, with transversely running uniformly spaced-apart notches, in which the individual objects which are to be conveyed can be set down. A walking beam lifts the objects which have been set down in uniformly spaced-apart notches and, in a circular movement, set them down again one stage further on. The disadvantage with this known prior art is that it is only suitable for moving or transporting objects essentially in the horizontal direction. Moreover, abrasive contact occurs during movement of the objects, and the objects which are to be moved are subjected, in part, to a rolling action. This rolling, action is frequently desired in order to achieve uniform heating of the objects moved through the furnace.

In the electronics industry, continuous furnaces are frequently used for ageing components artificially and/or for baking coatings, etc. On account of their comparatively high space requirement, the conventional continuous furnaces cannot readily be integrated in production lines or assembly lines.

It is thus an object of the present invention to specify a continuous furnace which can be integrated more easily in existing production lines. It is also an object of the present invention to specify a conveying apparatus, in particular for such a continuous furnace, which allows a greater freedom of choice as regards the conveying direction.

The provision of at least one conveying-beam pair and of at least one retaining-beam pair, which are located opposite one another in each case with the conveyable object between them, makes it possible to choose virtually any conveying direction, in particular a vertical one. By guiding the conveying beams in opposite directions along suitable curved paths, it maybe ensured that abrasive contact does not occur between the objects which are to be conveyed and the retaining beams, on the one hand, and the conveying beams, on the other hand. The avoidance of abrasive contact means that there is virtually no wear during the transportation of the objects which are to be conveyed, with the result that it is possible to maintain clean conditions, as are frequently required in the electronics and semiconductor industry.

According to the advantageous configuration of the invention, the conveying beams, or the retaining teeth of the conveying beams, rather than following a closed curved path, move back and forth along a curved path with a starting point and an end point.

The curved paths of the retaining teeth ensure that the contact between the retaining teeth and the objects which are to be conveyed takes place without any abrasive movement whatsoever, and that material wear is thus prevented.

The vertical conveying direction of the continuous furnace provides a space-saving arrangement which can be integrated more easily in existing production lines.

The rest of the subclaims relate to further advantageous configurations of the invention.

Further details, features and advantages of the invention can be gathered from the following description of preferred embodiments with reference to the drawings, in which:

FIG. 1 shows a schematic illustration of an exemplary embodiment of the invention for transporting or conveying sheet-like objects in the vertical direction;

FIGS. 2 to 5 show, in views a and b in each case, schematic illustrations for the purpose of explaining the sequence of movements during the conveying operation;

FIG. 19a shows a diagram for the purpose of explaining the time sequences and synchronization of the individual movement sequences in the continuous furnace; and FIG. 19b shows a diagram for the purpose of is illustrating the curved paths of the retaining teeth of the conveying and retaining beams.

Figure 3A:
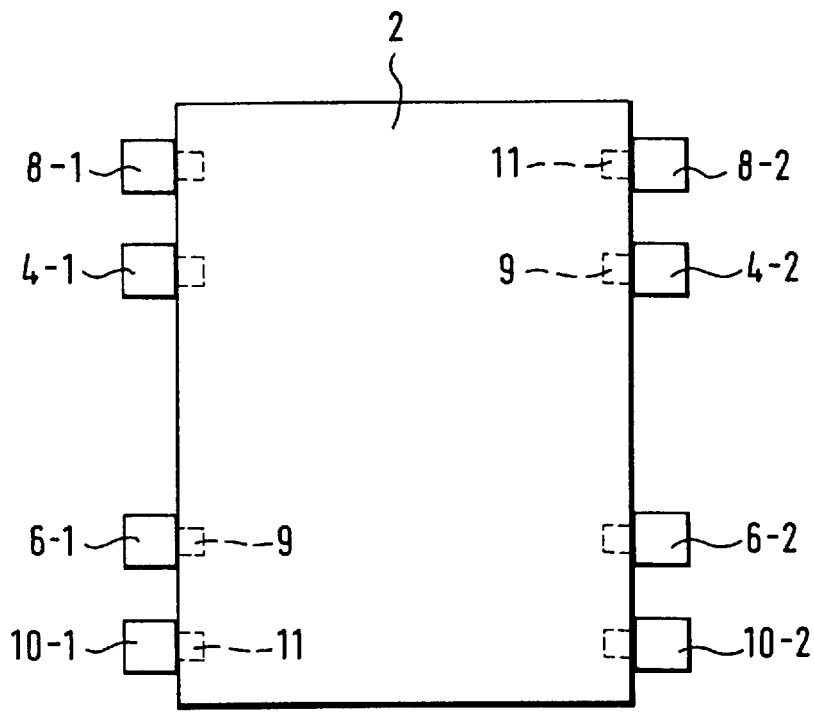
Figure 3B:
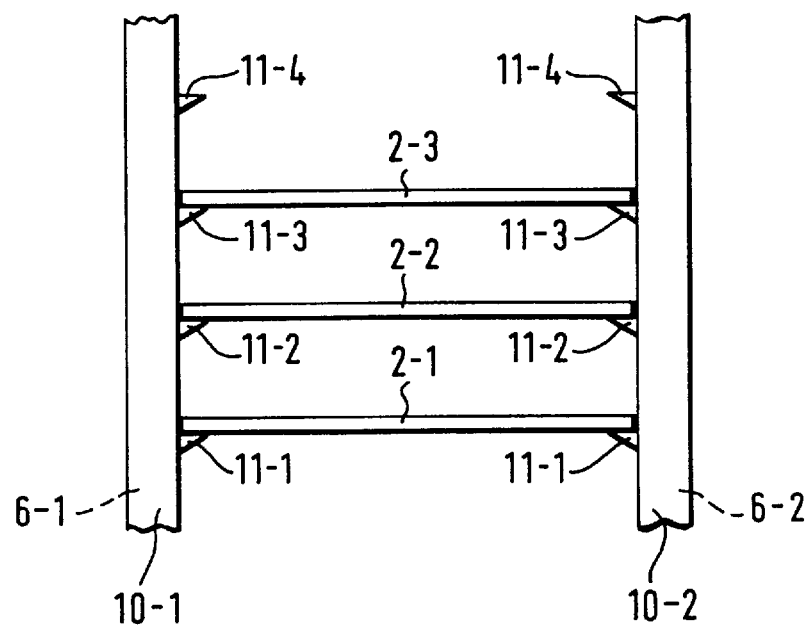
Figure 4A:
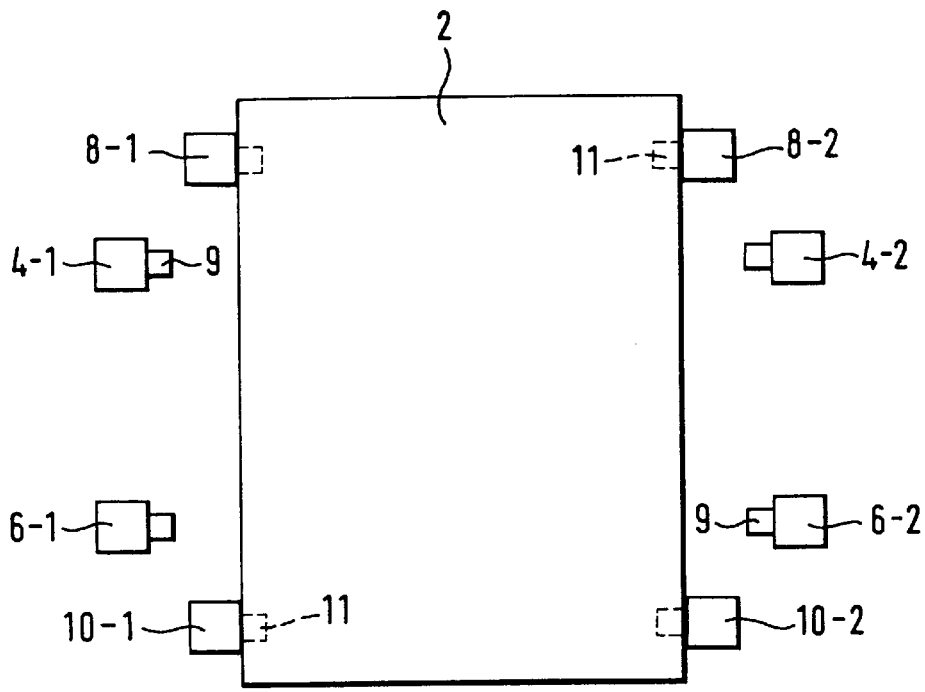
Figure 4B:
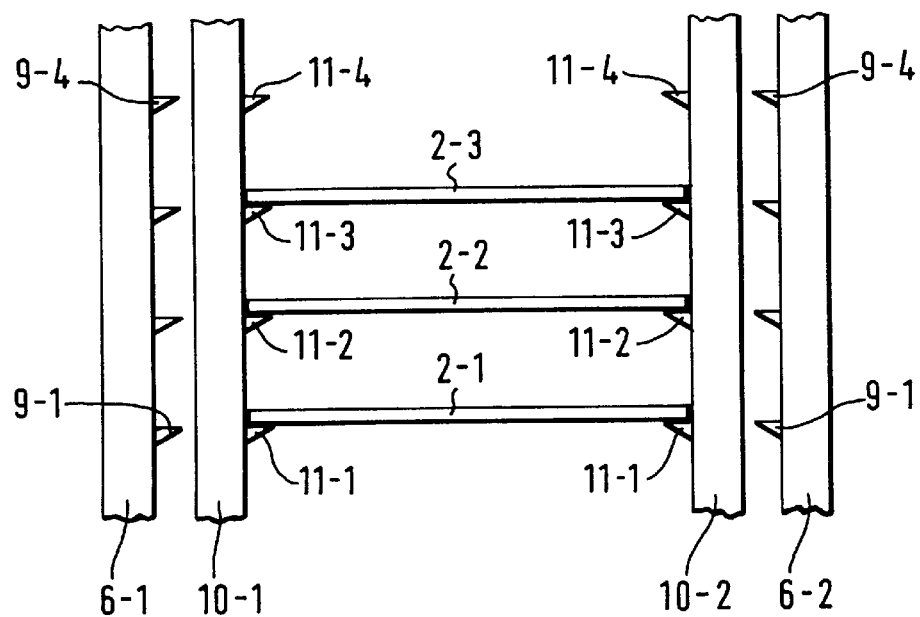
Figure 5A:
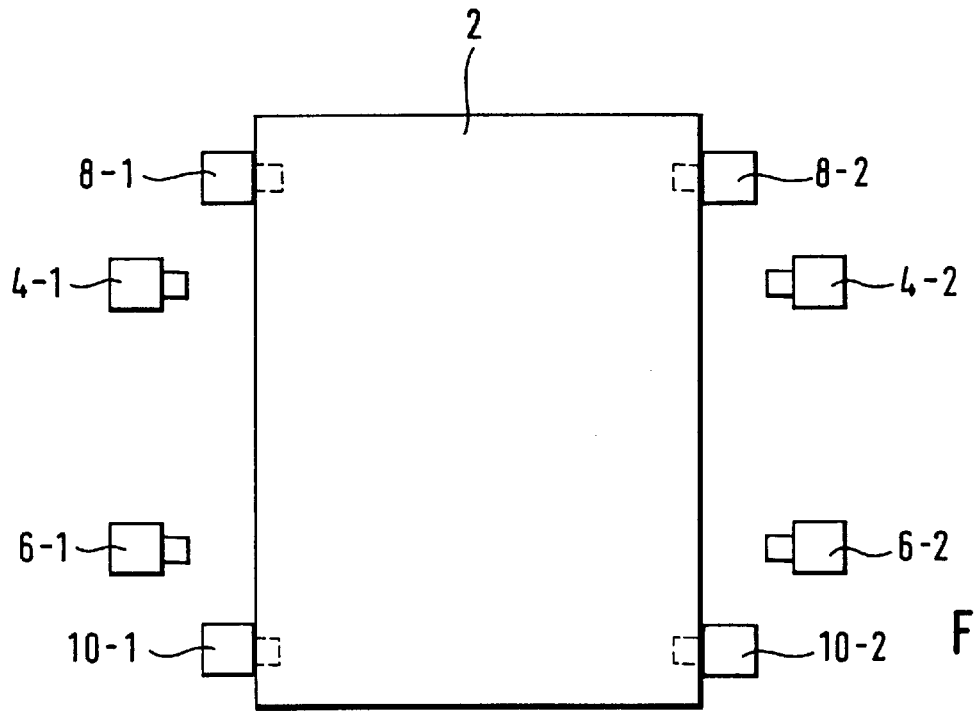
Figure 5B:
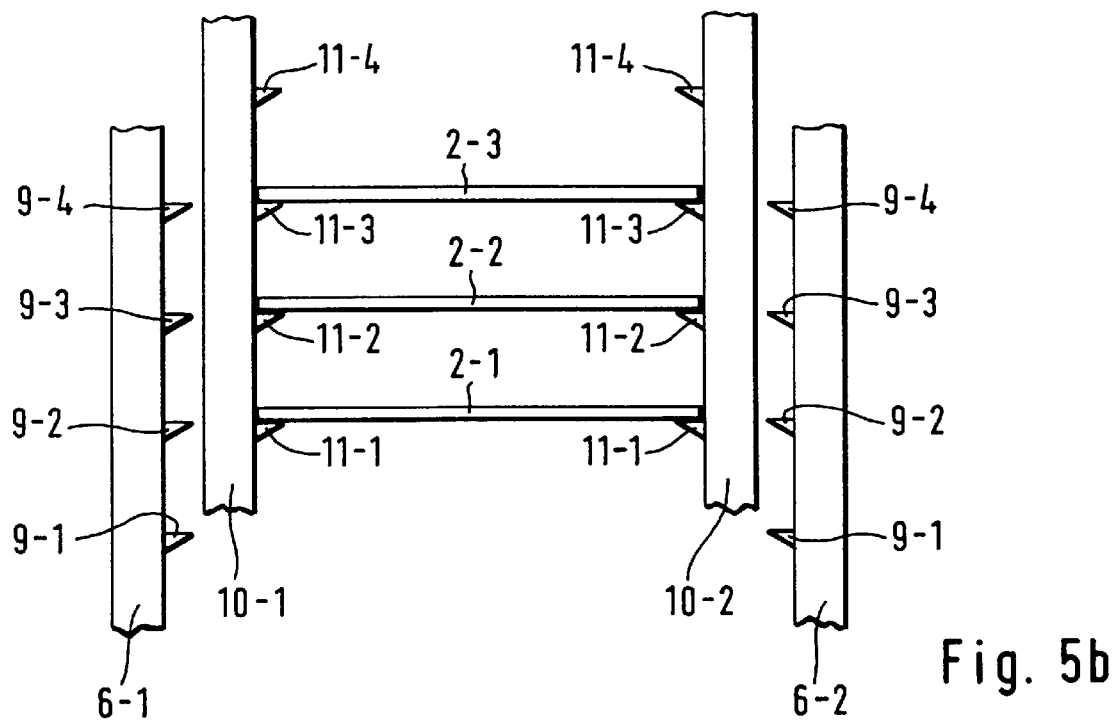

FIG. 1 shows a schematic illustration of an exemplary embodiment of the invention for transporting or conveying sheet-like objects 2 in discrete steps of height Δh. The conveying apparatus comprises in each case two pairs of retaining beams 4-1, 4-2 and 6-1 and 6-2, which are arranged vertically on opposite sides of the objects 2 which are to be transported or conveyed. In the same way, four conveying beams 8-1, 8-2 and 10-1, 10-2 are provided, and these are likewise arranged vertically, i.e. in the transporting or conveying direction, on opposite sides of the objects 2 which are to be conveyed. The retaining beams 4 and 6 are provided with retaining teeth 9 which are oriented in the direction of the object 2 which is to be conveyed. Likewise, the conveying beams 8 and 10 are provided with retaining teeth 11. When the respective beams 4, 6, 8, 10 are in engagement with the objects 2 which are to be conveyed, the objects 2 bear on the retaining teeth 9 and 11.

The principal mode of operation of the conveying apparatus illustrated in FIG. 1 is explained hereinbelow with reference to FIGS. 2 to 5. In this case, FIGS. 2a, 3a, 4a and 5a are plan views of the apparatus according to FIG. 1 in the direction of the arrow 12, and FIGS. 2b, 3b, 4b and 5b are views of the apparatus according to FIG. 1 in the direction of the arrow 14.

To aid clarity, the objects which are to be transported are designated by 2-1, 2—2 and 2-3 in FIGS. 2 to 5. In the same way, to aid clarity, the retaining teeth 9 and 11 for the different objects 2-i which are to be transported are designated by 9-i and 11-i.

FIG. 2 shows a state in which the retaining beams 4 and 6 retain the objects 2-i which are to be transported, i.e. the retaining beams 4 and 6 are in the CLOSED position. In this case, the objects 2-i which are to be transported bear on the top side of the retaining teeth 9-i. In contrast, the conveying beams 8 and 10 are not in engagement with the objects 2 which are to be transported, i.e. the conveying beams are in the OPEN position.

FIG. 3 shows a state in which both the retaining beams 4 and 6 and the conveying beams 8 and 10 are in engagement with the objects which are to be transported; CLOSED position. That is to say the objects 2 which are to be transported bear both on the retaining teeth 9 of the retaining beams 4 and 6 and on the retaining teeth 11 of the conveying beams 8 and 10. FIG. 4, then, shows the state in which the objects 2 which are to be transported or conveyed are merely retained by the conveying beams 8 and 10, retaining teeth 11 (CLOSED position), whereas the retaining beams are spaced apart somewhat more from the objects 2 which are to be conveyed, and their retaining teeth 9 are not in engagement with the objects 2 which are to be conveyed (OPEN position).

FIG. 5, then, shows the state in which the conveying beams 8 and 10 lift the conveyable objects 2 in the conveying direction, i.e. vertically upward in this case, by the height of one vertical step Δh, with the result that the objects 2 which are to be transported are then offset upward by the height of one vertical step Δh with respect to the retaining teeth 9-i of the retaining beams 4 and 6. That is to say that the conveyable object 2-3, retained by the retaining teeth 11-3, is then located level with the retaining teeth 9-4 of the retaining beams 4 and 6.

In the next step, the teeth 9-i of the retaining beams are then brought into engagement again with the objects 2 which are to be conveyed, this resulting in an arrangement like that in FIG. 3, although now, rather than bearing on the retaining teeth 9-3, the object 2-3 which is to be conveyed bears on the retaining teeth 9-4, i.e. the objects 2-i which are to be conveyed have been offset upward by the height, of one vertical step Δh. The conveying beams 10 and 8 then move away again from the objects 2 which are to be conveyed and, in, addition, the conveying beams are lowered again by the height of one vertical step Δh, this resulting in an arrangement like that in FIG. 2. This means that the original state is reached again, and the sequence begins anew.

Figure 6:
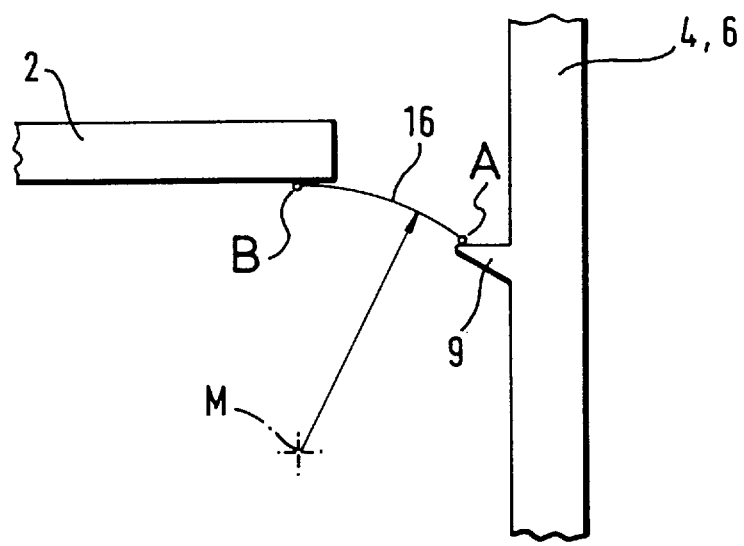
FIG. 6 shows an illustration of the curved path of the retaining beams.
Figure 7:
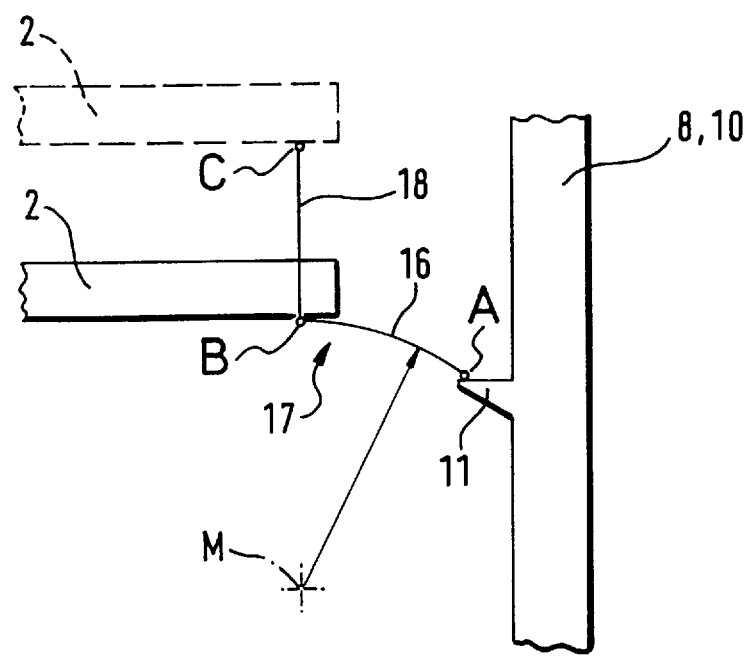
FIG. 7 shows a corresponding illustration of the curved path of the conveying beams.

FIGS. 6 and 7 show the movement curves or curved paths 16 and 17 of the retaining teeth 9 of the retaining beams 4 and 6 and of the retaining teeth 11 of the conveying beams 8 and 10. The movement curve 16 of the retaining teeth 9 is a circle arc between a starting point A and an end point B.

The curved path 17 likewise comprises the circle arc 16 and, in addition, a rectilinear subsection 18, extending from the point B straight upward to a point C. The circle arc 16 here is such that the point B constitutes a top dead center, i.e. the center point M of the circle arc 16 is located vertically beneath the point B. Whereas the retaining beams 4 and 6 merely move back and forth from A to B and back again from B to A along the circle arc 16, the conveying beams 8 ad 10 additionally execute a vertical lifting movement, extending upward from the point B to the point C. The movement back then takes place from the point C back to the point B, and from point B back again to point A. Consequently, both the retaining beams 4 and 6: and the conveying beams 8 and 10 essentially move back and forth.

This advancing and retreating of the retaining teeth 9 and 11 along the circle arc 16, with B as the top dead center, means that contact between the retaining teeth 9 and 11 and the objects 2 which are to be transported takes place without any abrasive movement. This method of conveying the objects 2 which are to be moved or conveyed virtually completely prevents material wear, which is very important, in particular, for using the conveying apparatus according to the invention in furnaces in production lines for electronic components.

An explanation is given hereinbelow, with reference to FIGS. 8 to 13, of an example of a mechanism by means of which the retaining beams 4 and 6 and the conveying beams 8 and 10 move through the curved paths 16 and 17 shown in FIGS. 6 and 7.

Figure 8:
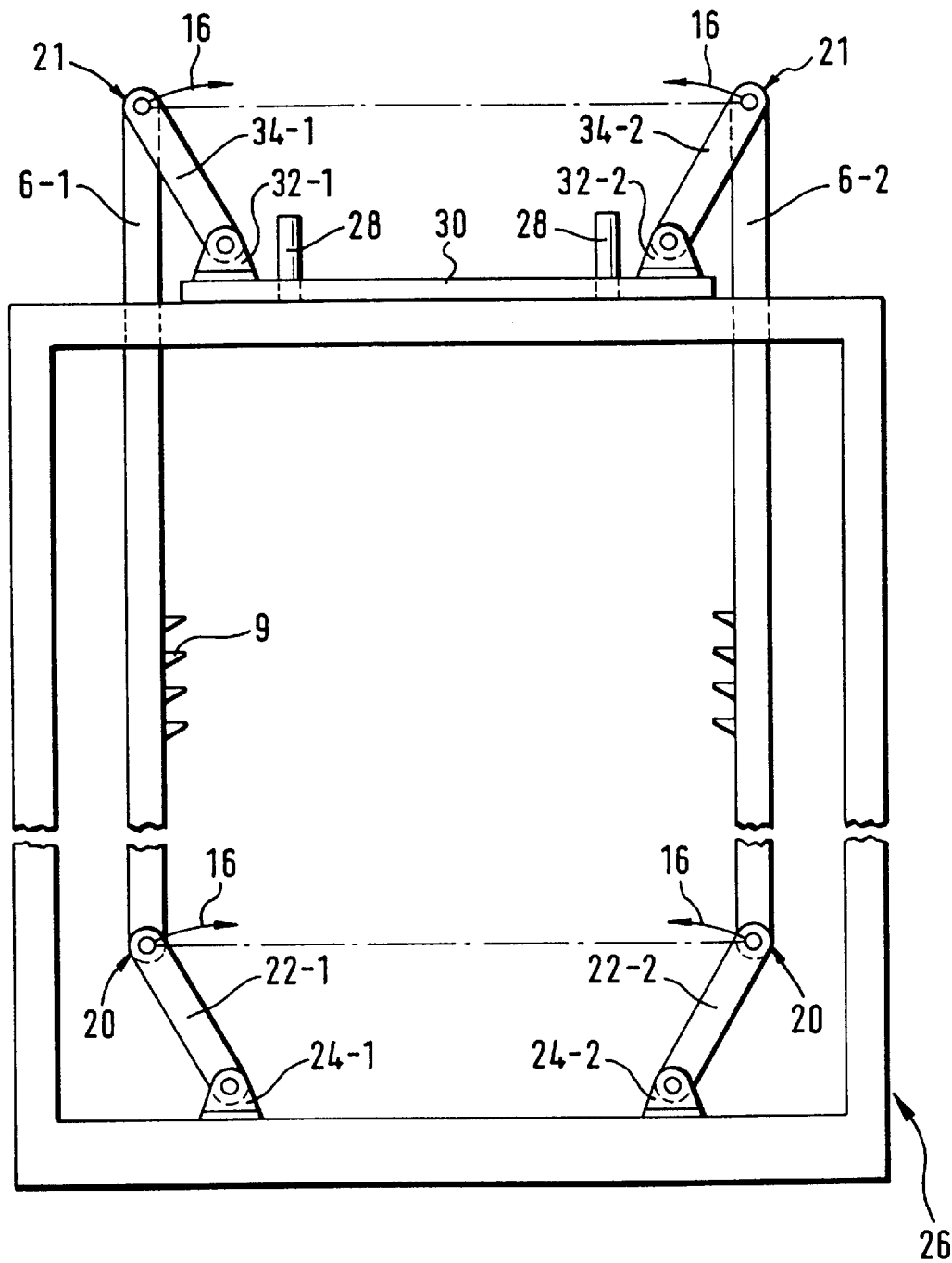
FIG. 8 shows an illustration of the arrangement of the retaining beams on the basic frame of the conveying apparatus.
Figure 9:
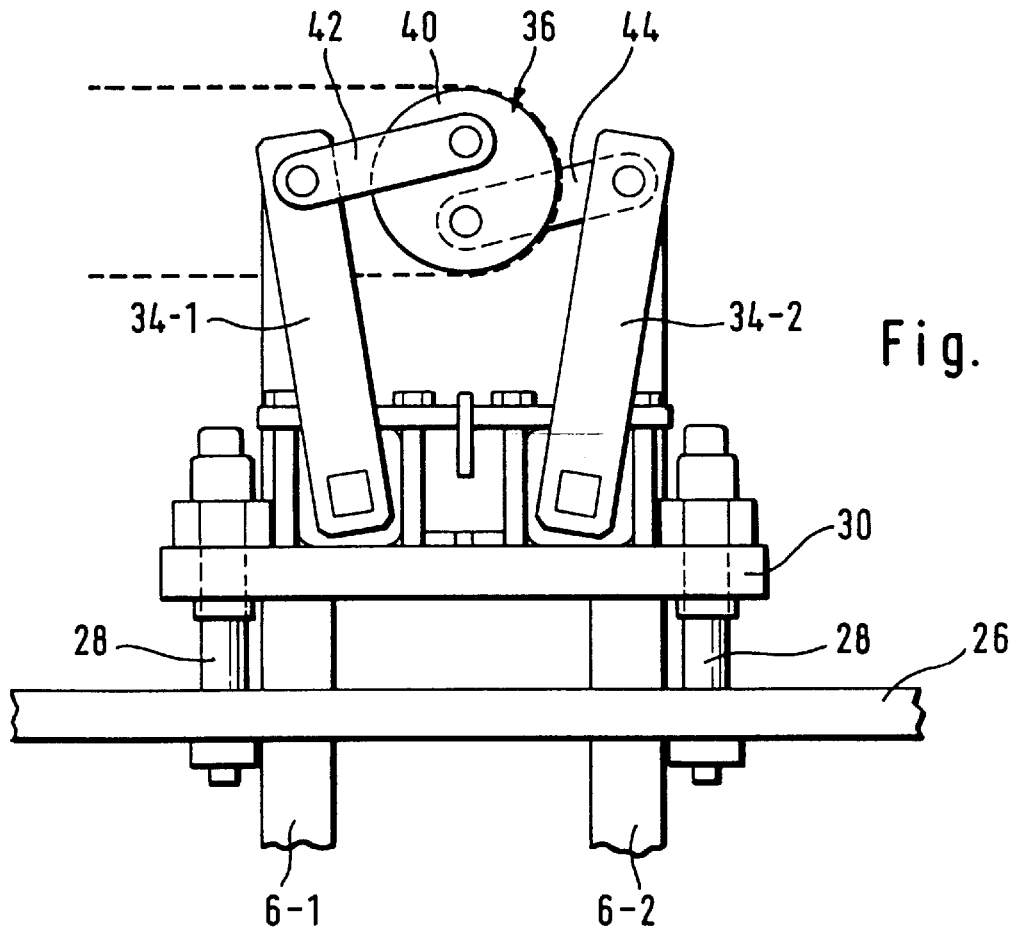
FIG. 9 shows the top eccentric drive of the retaining beams.
Figure 10:
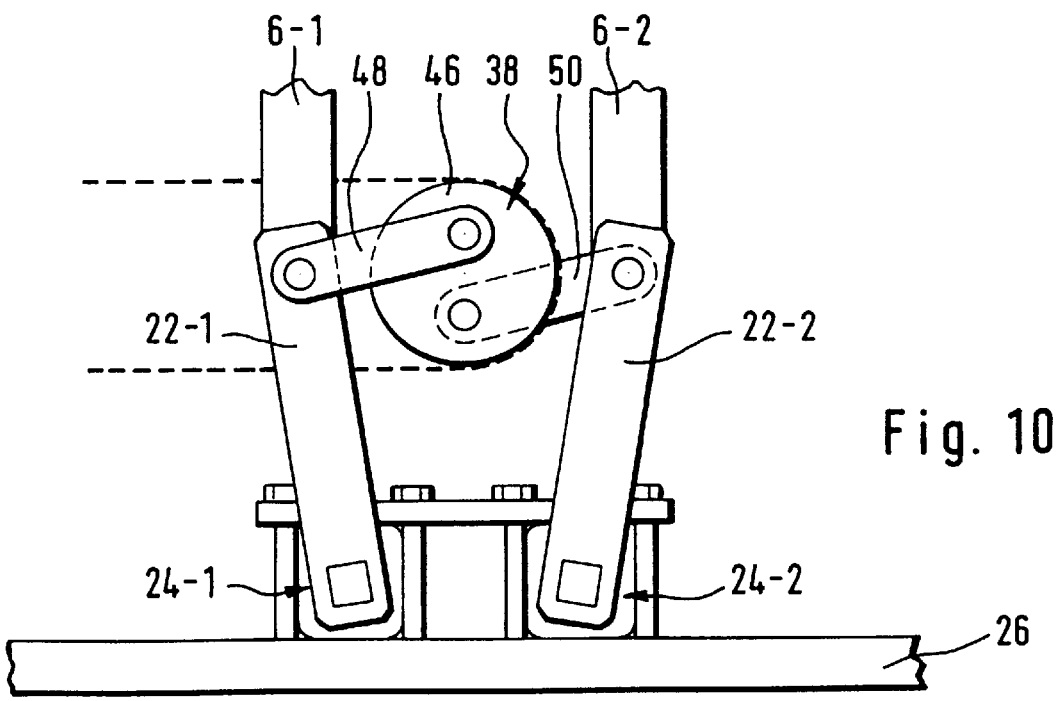
FIG. 10 shows the bottom eccentric drive of the retaining beams.

First of all, FIGS. 8 to 10 show the mechanism for the retaining beams 4 and 6, using the retaining beams 6-1 and 6-2 by way of example. As can be seen from FIG. 8, the retaining beams 6-1 and 6-2 are respectively fastened, at their bottom end 20, on an articulated mount 24-1 and 24-2 via articulated rods 22-1 and 22-2. The articulated mount 24 is connected fixedly to a basic frame 26 of the conveying apparatus. By virtue of the articulated rods 22 and by virtue of the articulated mount 24, the bottom ends 20 of the retaining beams 4 and 6 are thus connected to the basic frame 26 in a double-jointed manner.

The basic frame 26 is of an essentially cuboidal design, and the retaining beams 4 and 6 project beyond the top end of the basic frame 26. At the top end of the basic frame 26, by way of sliding pins 28, a carrier plate 30 is formed horizontally and connected to the basic frame 26 such that it can move in the vertical direction. Articulated mounts 32-1 and 32-2 are mounted on the carrier plate 30, and articulated rods 34-1 and 34-2 are articulated, by one end, to said articulated mounts. The other ends of the articulated rods 34 are articulated to the top ends 21 of the retaining beams 6.

The articulated rods 34 and 22 are dimensioned such that the retaining beams 6 can move along the circle arc 16. This movement back and forth between the points A and B in FIG. 6, along the circle arc 16, is effected by means of a first eccentric arrangement, which comprises a top eccentric 36 and a bottom eccentric 38, as can be seen from FIGS. 9 and 10, respectively. The top eccentric 36 comprises a rotatably mounted eccentric disc 40, on which a left-hand eccentric rod 42 and a right-hand eccentric rod 44 act. In the same way, the bottom eccentric 38 comprises an eccentric disc 46, on which a left-hand eccentric rod 48 and a right-hand eccentric rod 50 act eccentrically.

The top eccentric 36 and bottom eccentric 38 of the first eccentric arrangement are dimensioned such that synchronous rotation of the eccentric discs 40 and 46 moves the retaining beams 6-1 and 6-2, respectively, in opposite directions along the circle arcs 16. The retaining beams 4-1 and 4-2 are driven analogously or, preferably, by way of a rigid coupling of the retaining beams which are arranged directly one beside the other, i.e of 6-1 to 4-1 and of 6-2 to 4-2.

Figure 11:
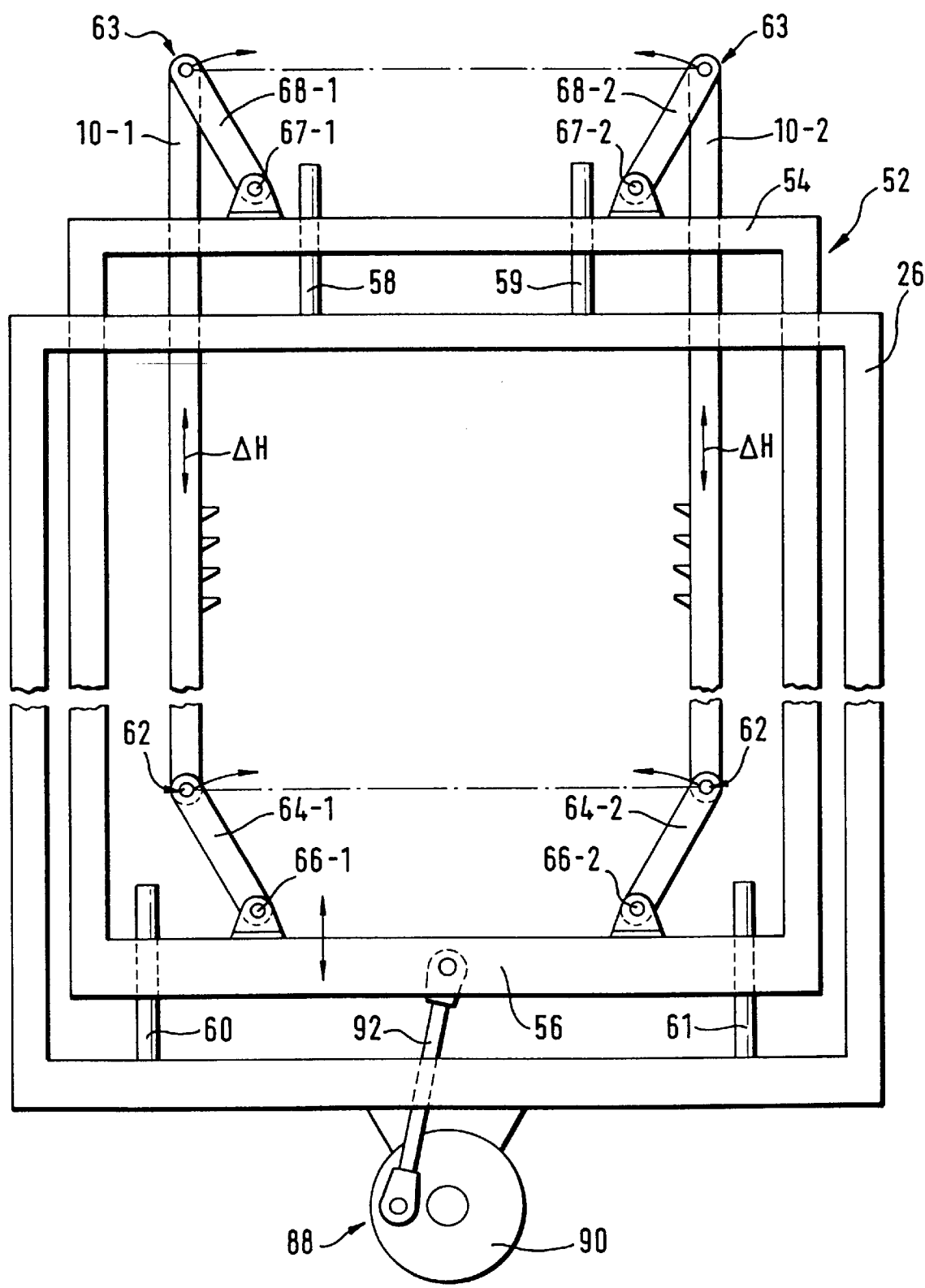
FIG. 11 shows an illustration of the arrangement of the conveying beams on the basic frame of the conveying apparatus.
Figure 12:
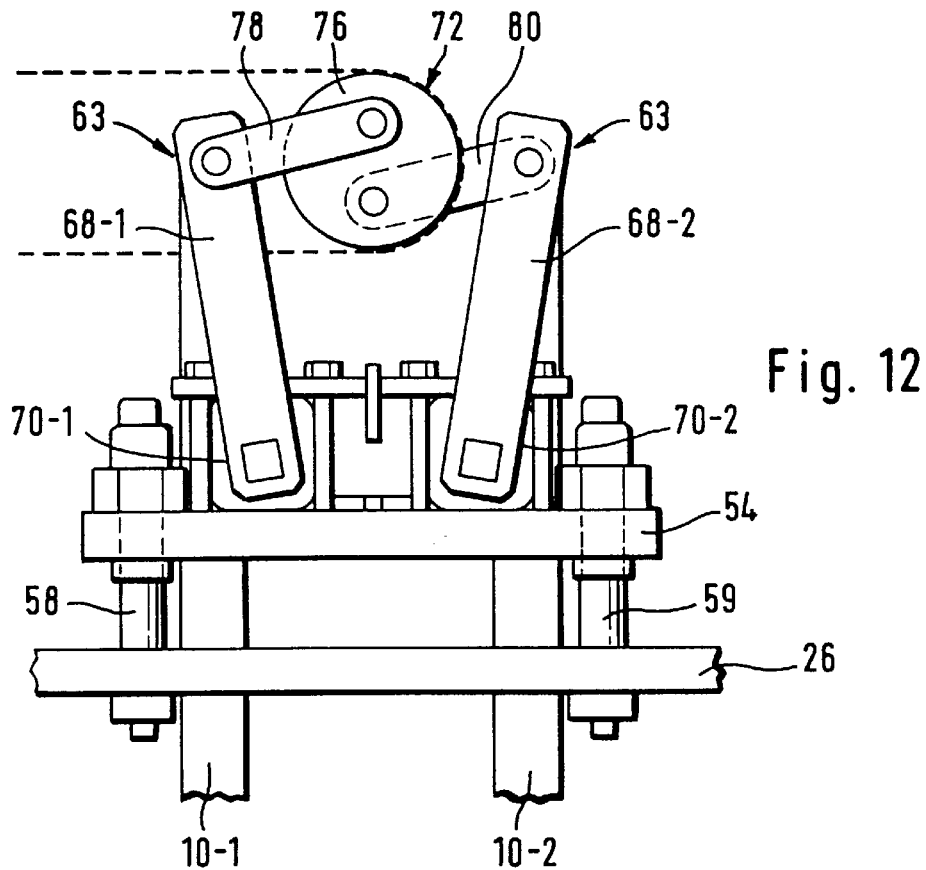
FIG. 12 shows the top eccentric drive of the conveying beams.
Figure 13:
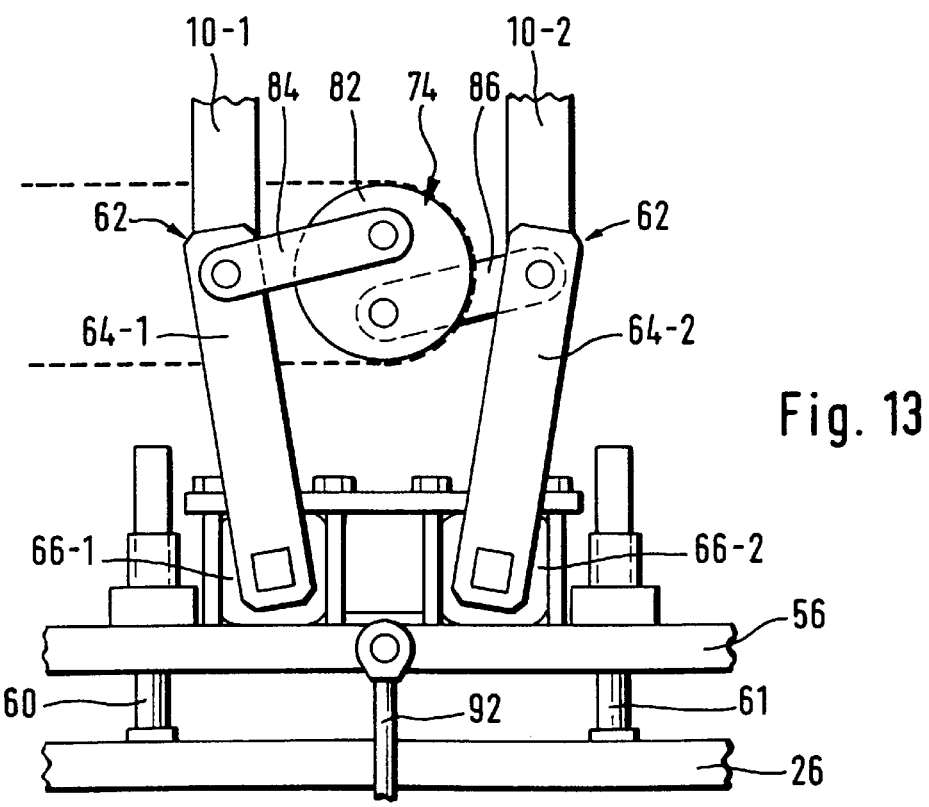
FIG. 13 shows the bottom eccentric drive of the conveying beams.

The mechanism for the conveying-beam drive is illustrated schematically in FIGS. 11 to 13. A lifting framework 52 with a top table panel 54 and a bottom table panel 56 is connected to the basic frame 26 such that it can move in the transporting or conveying direction. The ability to move in, and counter to, the transporting direction is achieved by the lifting framework 52 being mounted by means of sliding pins 58, 59, 60 and 61. In this case, the top sliding pins 58 and 59 are connected fixedly to the top region of the basic frame 26 and are mounted in a sliding manner in the top table panel 54. In the same way, the bottom sliding pine 60 and 61 are connected fixedly to the bottom region of the basic frame 26 and are mounted in a sliding manner in the bottom table panel 56.

As can be seen from FIG. 11, the conveying beams 10-1 and 10-2 are respectively fastened, at their bottom end 62, on an articulated mount 66-1 and 66-2 via articulated rods 64-1 and 64-2. The articulated mounts 66 are connected fixedly to the bottom table panel 54 of the lifting framework 52. By virtue of the articulated rods 64 and by virtue of the articulated mounts 66, the bottom ends 62 of the conveying beams 8 and 10 are thus connected to the lifting framework 52 in a double-jointed manner.

The lifting framework 52 is of an essentially cuboidal design, and the conveying beams 8 and 10 project beyond the top table panel 54. Articulated mounts 67-1 and 67-2 are mounted on the top table panel 54, and articulated rods 68-1 and 68-2 are articulated, by one end, to said articulated mounts. The other ends of the articulated rods 68 are articulated to the top ends 63 of the conveying beams 10.

The articulated rods 68 and 64 are dimensioned such that the conveying beams 8 and 10 can move along the circle arc 16. This movement back and forth between the points A and B in FIG. 7, along the circle arc 16, is effected by means of a second eccentric arrangement, which comprises a top eccentric 72 and a bottom eccentric 74, as can be seen from FIGS. 12 and 13, respectively. The top eccentric 72 comprises a rotatably mounted eccentric disc 76, on which a left-hand eccentric rod 78 and a right-hand eccentric rod 80 act. In the same way, the bottom eccentric 74 comprises an eccentric disc 82, on which a left-hand eccentric rod 84 and a right-hand eccentric rod 86 act eccentrically.

The top eccentric 72 and bottom eccentric 74 of the second eccentric arrangement are dimensioned such that synchronous rotation of the eccentric discs 76 and 82 moves the conveying beams 10-1 and 10-2, respectively, in opposite directions along the circle arcs 16. The conveying beams 8-1 and 8-2 are driven analogously via a further top eccentric 76' (see FIG. 15) and a further bottom eccentric (not illustrated specifically).

The conveying beams 10-1 and 10-2 are moved from the point B to the point C (in FIG. 7) by means of a third eccentric arrangement 88, which is shown schematically in FIG. 11. The third eccentric arrangement 88 comprises an eccentric disc 90, on which an eccentric rod 92 acts eccentrically, the other end of said rod being fitted on the bottom table panel 56 of the lifting framework 52. Rotation of the eccentric disc 90 causes the conveying beams 10-1 and 10-2, together with the lifting framework 52, to be lifted and lowered again, with the result that the retaining teeth 11 move back and forth between the points C and B, path section 18.

Figure 14:
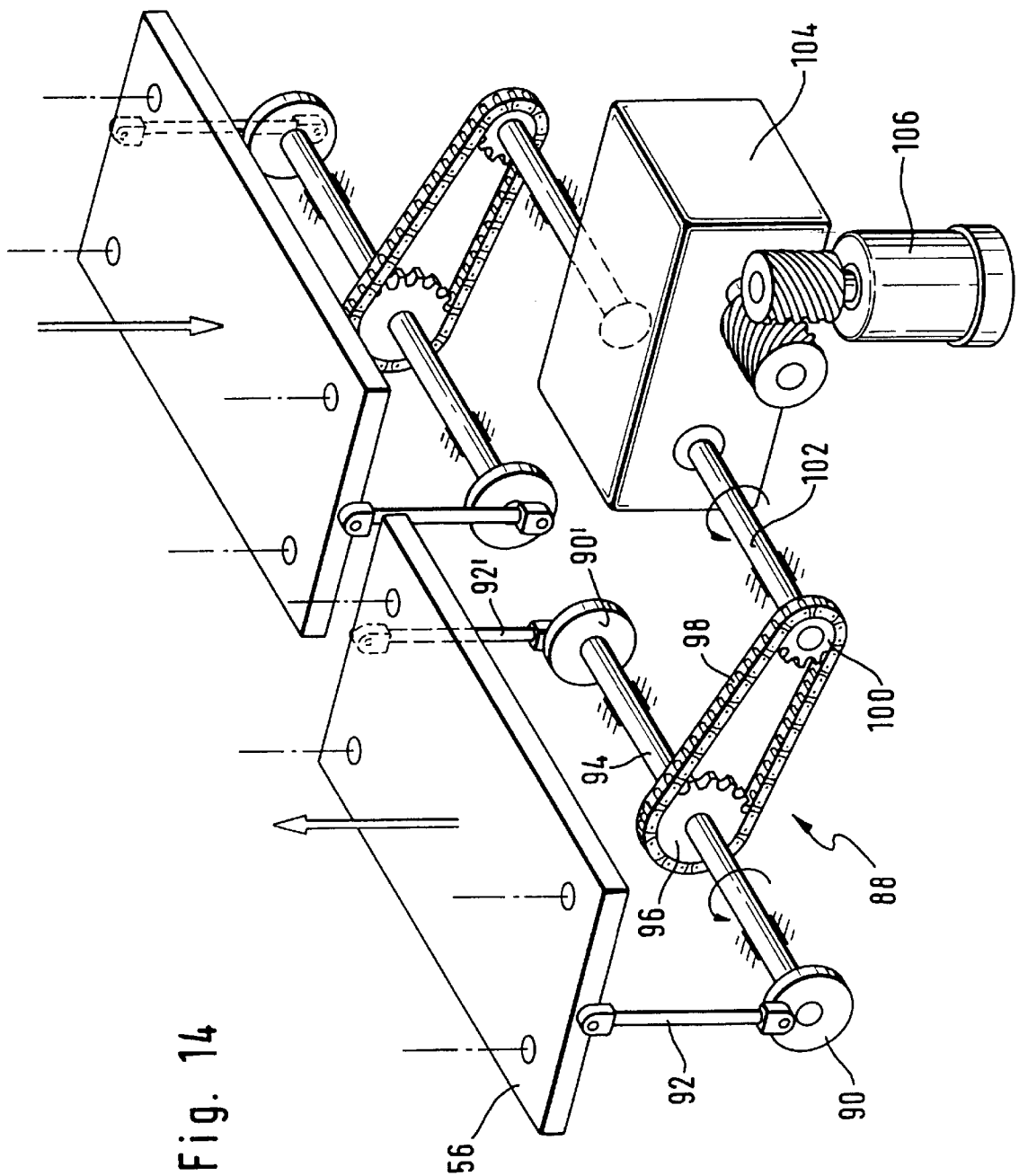
FIG. 14 shows a schematic illustration of the eccentric drive of the two lifting tables for the conveying beams of two vertical conveying apparatuses arranged one beside the other.

The mechanical drive of the individual eccentric arrangements is described with reference to FIGS. 14 and 15. FIG. 14 shows, on the left-hand side, the bottom table panel 56 of the lifting framework 52 with the third eccentric arrangement 88 connected thereto. The eccentric arrangement 88 comprises two eccentric discs 90 and 90' and two associated eccentric rods 92 and 92', these acting at opposite ends of the bottom table panel 56. The two eccentric disc 90 and 90' are connected via a shaft 94. The shaft 94 is driven via a gear wheel 96 and a chain 98, which, in turn, is driven by a gear wheel 100. The gear wheel 100 is connected fixedly to a shaft 102, which is driven by a drive block 104 with an electric motor 106.

Figure 15:
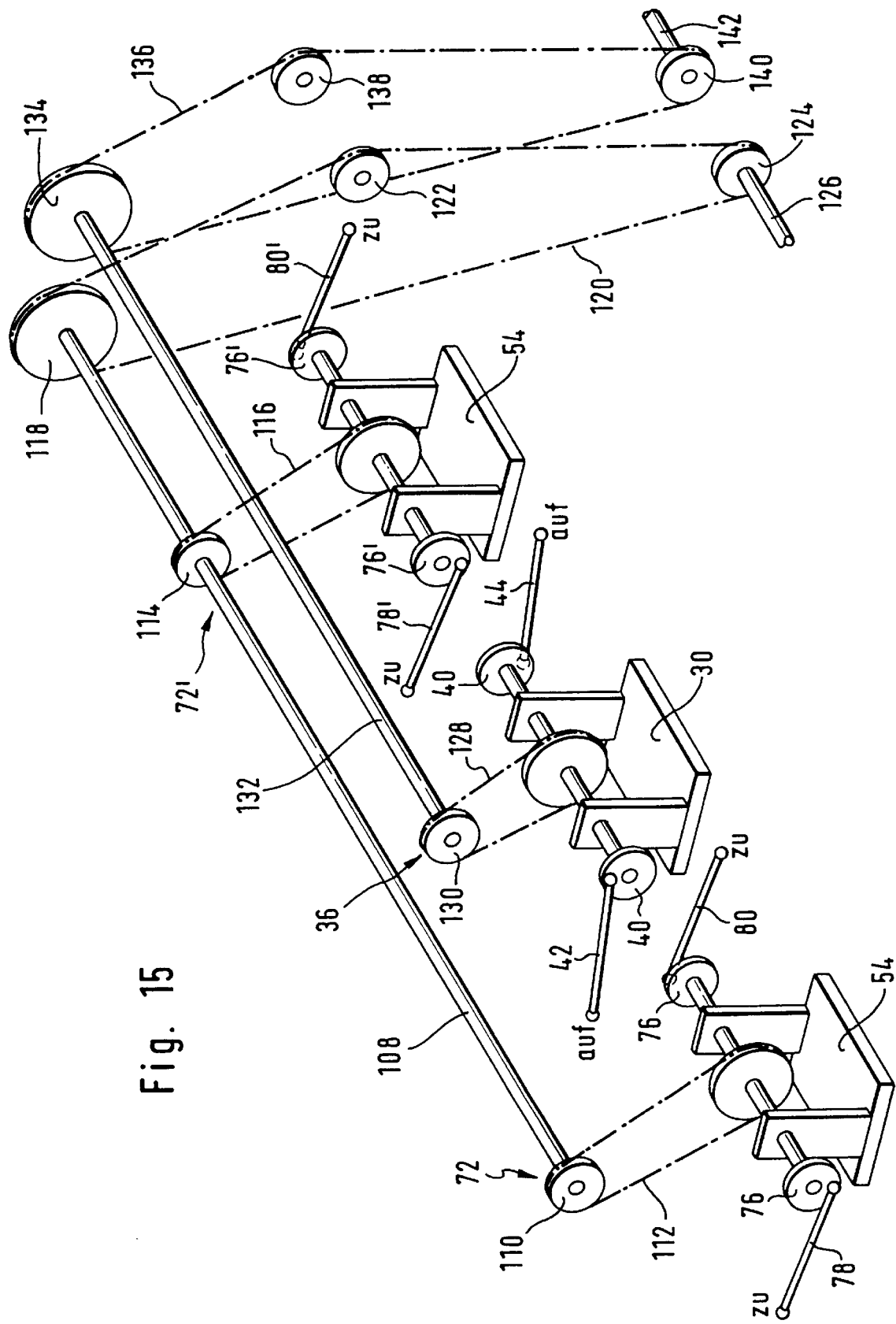
FIG. 15 shows a schematic illustration of the drive of the top eccentric.

FIG. 15 shows, schematically, the drive of the top eccentric 72 for the conveying beams 8 and 10, and also shows the top eccentric 36 with a drive of the retaining beams 4 and 6. The conveying beams 10-1 and 10-2 are driven by the eccentric 72, and the conveying beams 8-1 and 8-2 are driven by the eccentric 72'. The eccentrics 72 and 72' are driven via a shaft 108, on which a gear wheel 110 drives the eccentric discs 76 by means of a chain 112 and a gear wheel 114 drives the eccentric discs 76' by means of a chain 116. The shaft 108 is driven via a gear wheel 118 and a chain 120 which runs over gear wheels 122 and 124. The gear wheel 124 is seated on a shaft 126, which is driven via a drive block (not illustrated specifically).

Analogously, the eccentric 36 is driven via a chain 128 and a gear wheel 130 which is mounted fixedly on a shaft 132. The shaft 132 is driven by means of a gear wheel 134 and a chain 136. The chain 136 runs over gear wheels 138 and 140. The gear wheel 140 is mounted fixedly on a shaft 142, which is driven by a drive block (not illustrated specifically).

The abovedescribed conveying apparatus is suitable, in particular, for vertical continuous furnaces. The term "vertical" is intended to express the fact that the transporting direction in the furnace is vertical. A vertical continuous furnace with two of the abovedescribed conveying apparatuses will now be explained with reference to FIGS. 16 to 19.

Figure 16:
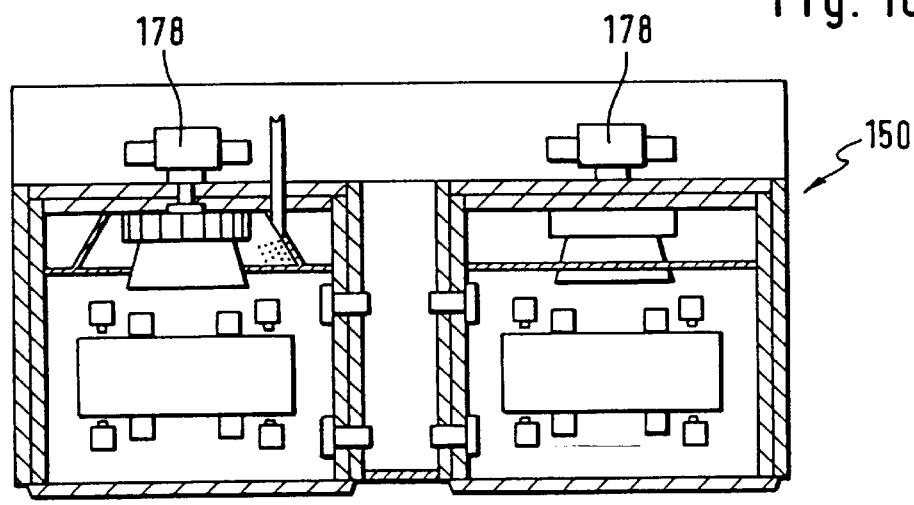
FIG. 16 shows a sectional view, along the plane B—B in FIG. 17, of a vertical continuous furnace with two vertical conveying apparatuses arranged one beside the other.
Figure 17:
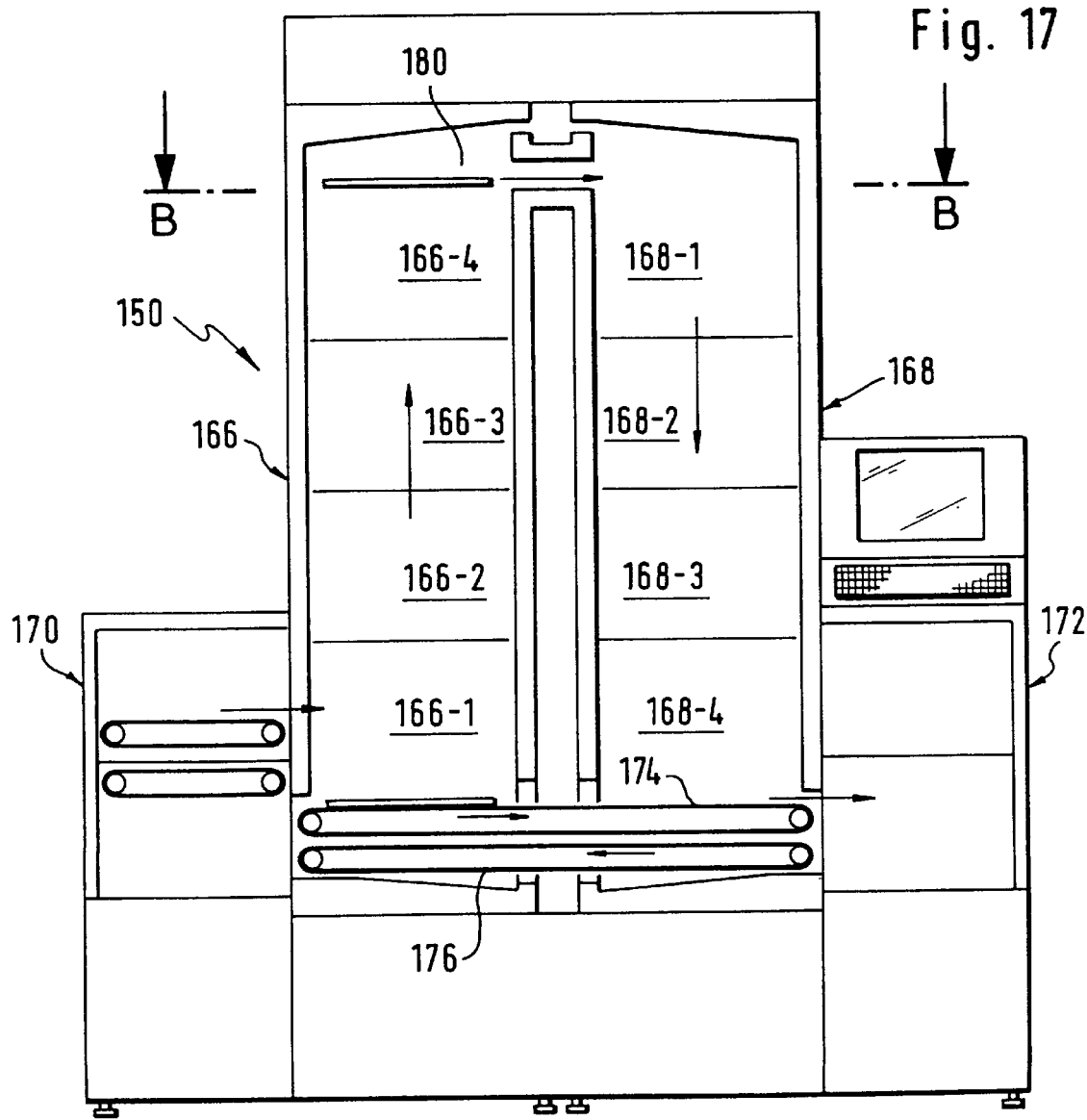
FIG. 17 shows a front view of the vertical continuous furnace according to FIG. 16.

FIG. 17 shows a front view of a continuous furnace 150 according to the present invention, FIG. 16 shows a section along the plane B—B in FIG. 17. The products, for example microprocessors, which are specifically heated and/or cooled in the continuous furnace 150, are located on carriers 152 which comprise a plurality of carrier elements 154 and a carrier frame 156. The carrier 152 illustrated in FIG. 18 comprises two carrier elements 154-1 and 154-2. The carrier or carriers 152 has/have a rectangular format with long sides 158, 159 and broad sides 160, 161. As can be seen from FIG. 18b the long sides 158, 159 are bent in laterally in the form of a u and form stand strips 162 and 163. The retaining teeth 11 of the conveying and retaining beams 4, 6, 8, 10 act on these stand strips 162, 163.

Figure 18A:
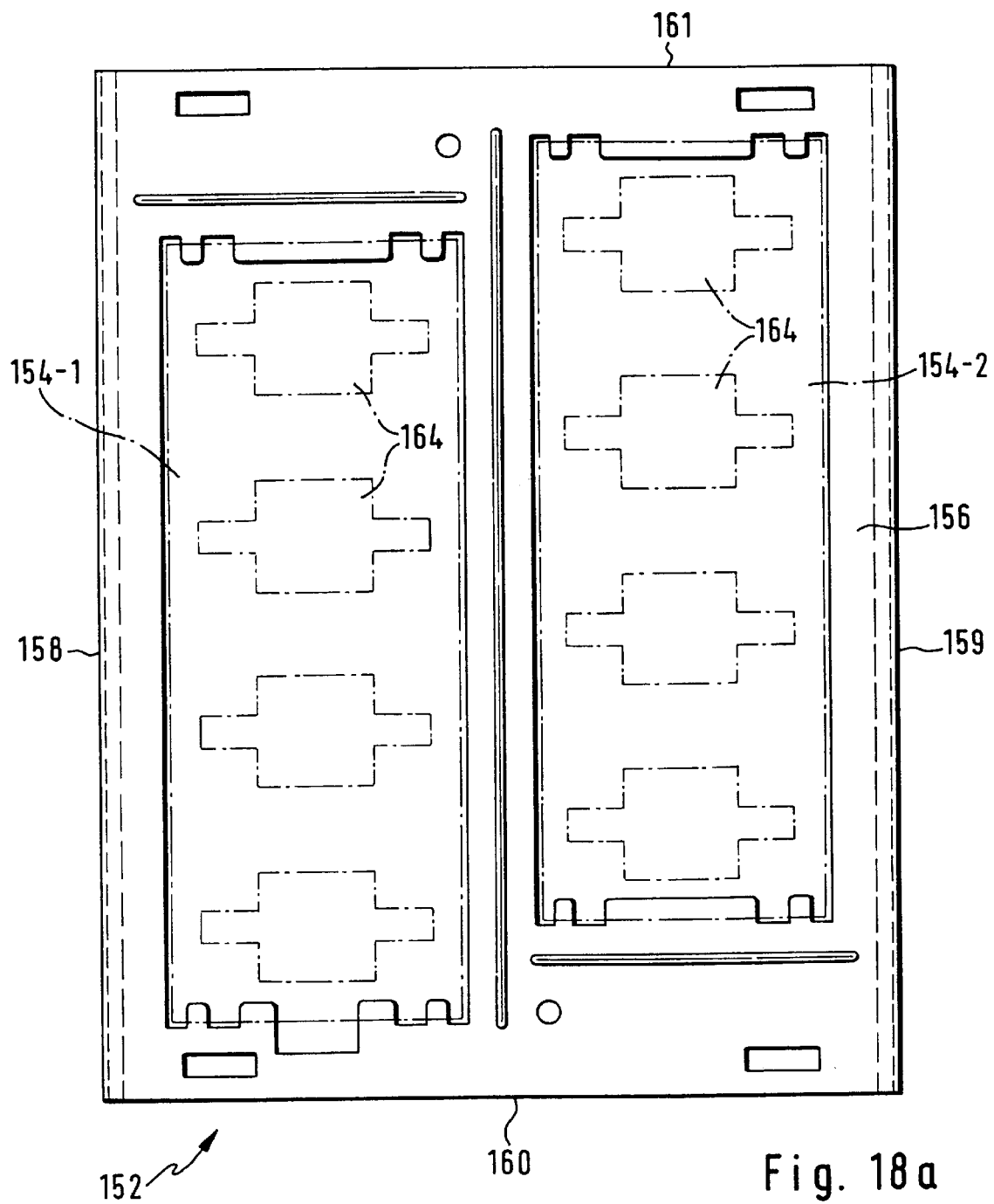
Figure 18a shows a plan view of a carrier as is used in the continuous furnace according to FIGS. 16 and 17.
Figure 18B:
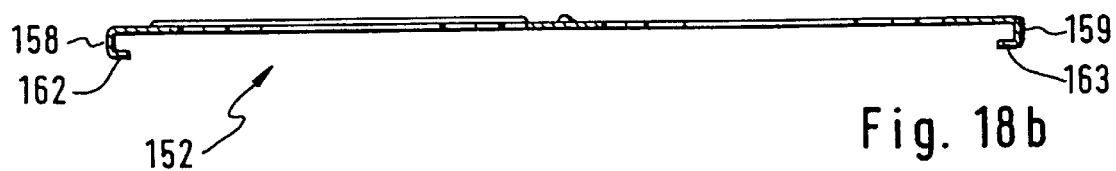
FIG. 18b shows a sectional view of the carrier of FIG. 18a along the line B—B.

As can be seen from FIG. 18a, the carriers 152, which are rectangular in plan view, have two likewise rectangular carrier elements 154-1 and 154-2 bearing on them one beside the other, with their long sides adjacent. Four set-down areas 164 for microprocessors are provided on each carrier element 154. The carrier elements 154-1 and 154-2 are arranged on the carrier frame 156 such that they are offset laterally with respect to one another. Consequently, the set-down areas 164 are also arranged such that they are offset laterally with respect to one another, in a staggered manner. In the continuous furnace 150, the heating or cooling of the products is carried out by means of a gas stream which passes over the products in a direction parallel to the broad sides 160, 161 of the carriers 152. The offset arrangement of the set-down areas 164, and thus of the products located therein, prevents a product on the carrier element 154-2 from getting in the way of a product on the carrier element 154-1. Consequently, all the products are heated or cooled uniformly since the partial process-gas stream passing over a product has not passed over any product prior to this.

The continuous furnace 150 comprises a first vertical furnace column 166 and a second vertical furnace column 168, the two being arranged one beside the other and each having four furnace regions 166-1 to 166-4 and 168-1 to 168-4. Arranged on the left-hand side beside the first furnace column 166 is a means 170 for supplying the carriers 152 into the furnace region. Arranged on the right-hand side beside the second furnace column 168 is a means 172 for removing the carriers from the furnace region. The means 170 and 172 also have a top conveying belt 174 and a bottom conveying belt 176, these being arranged one above the other, or one beneath the other, in the bottom region of the furnace columns 166 and 168. Each of the eight furnace regions 166-i, 168-i comprises a laterally arranged heating/cooling means 178 which channels air or process gas into the respective furnace region transversely to the conveying direction.

Carrier frames 152 each having two carrier elements 154 are charged with the products by way of the means 170. By virtue of the top conveying belt 174, the carriers 152 are introduced in a stepwise manner into the first furnace region 166-1 and, there, they are conveyed upward in the arrow direction through the furnace regions 166-2 to 166-4 by conveying and retaining beams 4, 6, 8, 10. At the top end of the uppermost furnace region 166-4 of the first furnace column 166, the respectively uppermost carrier 152 is seized by a transverse conveying means 180 and conveyed in the horizontal direction into the uppermost region of the uppermost furnace region 168-1 of the second furnace column 168. There, the carriers are seized by the retaining and conveying beams of the second furnace column 168 and conveyed vertically downward in a stepwise manner through the furnace regions 168-2 to 168-4.

In the bottom region of the lowermost furnace region 168-4 of the second furnace column 168, the carriers 152 are set down on the top conveying belt 174, which conveys to the right in FIG. 17, and are conveyed into the means 172. There, the carrier elements 154 are separated from the carrier frames 156. The carrier frames 156 are conveyed back into the means 170 by the bottom conveying belt 176 conveying in the opposite direction, to the left in FIG. 17, and, in the means 170, are charged with carrier elements 154 again, with the result that the carrier elements 154 begin the circuit anew.

As far as the transverse conveying means 180 is concerned, you are referred to the contents of the parallel patent application of the applicant of this application, said parallel patent application having the title "Fördervorrichtung zum Befördern von Objekten in gerader Richtung und damit ausgerüteter Durchlaufofen" [Conveying apparatus for conveying objects in a rectilinear direction, and continuous furnace equipped therewith]. Attorney file reference P/LU4102/DE.

FIG. 19a shows the time sequence and synchronization of the individual operations in the continuous furnace 150. The following abbreviations or designations are used in FIG. 19;

| | |
|---|---|
| TRAY | Carrier 152 |
| AZH | Conveying beams 8 and 10 |
| AZ | Retaining beams |
| HUB | Movement of the carriers 152 by the height of one vertical step |
| DG | Transverse conveying means 180 |
| QTV | Transportation of a carrier 152 by the transverse conveying means 180 to the right |
| QTR | Transportation of a carrier 152 by the transverse conveying means 180 to the left |
| AZH/AZ | Closed/open: the conveying beams 8 and 10/retaining beams 4 and 6 respectively act on the carriers 152 or are released therefrom, see FIG. 19b; |
| HUB | Lower/lift: the conveying beams 8 and 10 move downward/upward by the height of one vertical step Δh; |
| DG | Grip/lift: the transverse conveying means seizes the uppermost carrier in the first furnace column; |
| QTV | Displace: the transverse conveying means conveys the seized carrier to the right into the second furnace column; |
| DG | Release/set down: the transverse conveying means transfers the respective carrier to the retaining beams of the second furnace column; |
| QTR | Displace: the transverse conveying means moves back to the left into the first furnace column without any carrier. |

The operations of FIG. 19a which are numbered 1 to 7 and take place in the first furnace column 166, run in parallel with the operations numbered 12 to 18, which take place in the second furnace column.

List of Designations

2 Objects which are to be conveyed
4, 6 Retaining beams
8, 10 Conveying beams
9, 11 Retaining teeth
16, 17 Curved paths of the retaining teeth 9, 11
18 Rectilinear subsection of 17
20 Bottom end of 4, 6
21 Top end of 4, 6
22 Articulated rods
24 Articulated mount
26 Basic frame
28 Sliding pins
30 Carrier plate
32 Articulated mount
34 Articulated rods
36 Top eccentric
38 Bottom eccentric
40 Eccentric disc for 36
42 Left-hand eccentric rod of 36
44 Right-hand eccentric rod of 36
46 Eccentric disc of 38
48 Left-hand eccentric rod of 38
50 Right-hand eccentric rod of 38
52 Lifting framework
54 Top table panel
56 Bottom table panel
58, 59 Top sliding pins
60, 61 Bottom sliding pins
62 Bottom end of 8, 10
63 Top end of 8, 10
64 Bottom articulated rods
66 Bottom articulated mount 67 Top articulated rods
68 Top articulated mount
72 Top eccentric
74 Bottom eccentric
76 Eccentric disc of 72
78, 80 Eccentric rods of 72
82 eccentric disc of 74
84, 86 Eccentric rods of 74
88 Third eccentric arrangement
90, 90' Eccentric discs of 88
92 Eccentric rod of 88
94 Shaft of 88
96, 100, 110, 114, 118, 122, 124, 130, 134, 138, 140 Gear wheel
98, 112, 116, 120, 136 Chain
102, 108, 126, 132, 142 Shaft
104 Drive block
106 Electric motor of 104
150 Vertical continuous furnace
152 Carrier
154 Carrier elements
165 Carrier frame
158, 159 Long sides of 152
160, 161 Broad sides of 152
162, 163 Stand strips of 152
164 Set-down areas in 152 and 154
166 First furnace column
166-i Furnace regions in 166
168 Second furnace column
168-i Furnace regions in 168
170 Supply means for carrier 152
172 Removal means for carrier 152
174 Top conveying belt
176 Bottom conveying belt
178 Heating/cooling means
180 Transverse conveying means

I claim:

1. A conveying apparatus for simultaneously conveying a plurality of objects in discrete steps, having at least two conveying beams for moving in one conveying direction the objects which are to be conveyed, comprising:
   at least two retaining beams for retaining the objects which are to be conveyed,
   the conveying beams and retaining beams each being arranged parallel to one another on opposite sides of the objects which are to be conveyed, and each being provided with a multiplicity of retaining teeth which act on the objects, and
   having a drive means for moving the retaining beams back and forth in opposite directions, synchronously with one another, essentially perpendicularly with respect to the conveying direction, and
   for moving the conveying beams in opposite directions, synchronously with the movement of the retaining beams and synchronously with one another, along curved paths, such that, over a subregion of the paths, from an initial-contact point (B) to an end-contact point (C), retaining teeth of the conveying beams are in engagement with the objects which are to be conveyed, the initial-contact point (B) and the end-contact point (C) being offset in the conveying direction by the height of one vertical step (Δh).

2. The apparatus as claimed in claim 1, wherein at least one of the conveying and the retaining beams move back and forth in opposite directions.

3. The apparatus as claimed in claim 2, wherein at least one of the curved paths of the conveying beams and of the retaining teeth of the retaining beams, have an arc-shaped section, in particular a circle-arc-shaped section, and a rectilinear section, the rectilinear section of the path running in the conveying direction.

4. The apparatus as claimed in claim 2, wherein at least one of the retaining beams and the retaining teeth of the retaining beams, move back and forth along an arc-shaped curved path, in particular a circle-arc-shaped curved path.

5. The apparatus as claimed in claim 1, wherein the retaining teeth of the conveying beams and/or of the retaining beams are arranged at equal distances from one another, and wherein the discrete steps are of equal lengths.

6. The apparatus as claimed in claim 1, wherein conveying takes place in a vertical direction.

7. The apparatus as claimed in claim 1, which further comprises a basic frame on which the conveying and retaining beams are mounted such that they can move.

8. The apparatus as claimed in claim 1,
   wherein the drive means comprises a conveying-beam drive and a retaining-beam drive,
   wherein the retaining-beam drive comprises a first eccentric arrangement for moving the retaining beams back and forth essentially in the direction transverse to the conveying direction,
   wherein the conveying-beam drive comprises a second eccentric arrangement for moving the conveying beams back and forth in the direction transverse to the conveying direction, and
   wherein the conveying-beam drive comprises a third eccentric arrangement for moving the conveying beams back and forth in the conveying direction.

9. The apparatus as claimed in claim 8, wherein the conveying beams and the second eccentric arrangement are mounted on a lifting framework, wherein the third eccentric arrangement is mounted fixedly on the basic frame and acts on the lifting framework, and wherein the lifting framework is connected to the basic frame such that it can move in the conveying direction.

10. The apparatus as claimed in claim 8, wherein the first and second eccentric arrangements each comprise a top eccentric and a bottom eccentric, the top eccentric acting at the top end of the conveying beams or retaining beams and the bottom eccentric acting at the bottom end of the conveying beams or retaining beams.

11. The apparatus as claimed in claim 10, wherein the bottom eccentric of the second eccentric arrangement is mounted on a bottom conveying-beam mount which is connected fixedly to the lifting framework, and wherein the top eccentric of the second eccentric arrangement is mounted on a top conveying-beam mount which is connected fixedly to the lifting framework and is connected to the basic frame such that it can move in the conveying direction.

12. The apparatus as claimed in claim 10, wherein the bottom eccentric of the first eccentric arrangement is mounted on the basic frame, and wherein the top eccentric of the first eccentric arrangement is mounted on a top retaining-beam mount which is connected to the basic frame such that it can move in the conveying direction.

13. The apparatus as claimed in claim 1, wherein the objects which are to be conveyed are of a sheet-like design and, in the conveying direction, have an extent which is smaller than the vertical step height of the conveying apparatus.

14. Apparatus as claimed in claim 13, wherein the objects which are to be conveyed each comprise a carrier and at least one product which can be connected releasably thereto.

15. The apparatus as claimed in claim 14, wherein the carriers comprise a carrier frame and at least one carrier element which can be connected releasably to the carrier frame and which carries the product.

16. The apparatus as claimed in claim 15, wherein the carrier element bears on the carrier frame.

17. A continuous furnace in which a plurality of carriers pass through a furnace region, comprising:

means for supplying the carriers, heating/cooling means for heating and/or cooling the furnace region, at least one conveying apparatus for conveying the carriers through the furnace region, the at least one conveying apparatus further comprising at least two conveying beams for moving in one conveying direction the objects which are to be conveyed, and at least two retaining beams for retaining the objects which are to be conveyed, (the conveying beams) and retaining beams each being arranged parallel to one another on opposite sides of the objects which are to be conveyed, and each being provided with a multiplicity of retaining teeth which act on the objects, and having a drive means for moving the retaining beams back and forth in opposite directions, synchronously with one another, essentially perpendicularly with respect to the conveying direction, and for moving the conveying beams in opposite directions, synchronously with the movement of the retaining beams and synchronously with one another, along curved paths, such that, over a subregion of the paths, from an initial-contact point (B) to an end-contact point (C), retaining teeth of the conveying beams are in engagement with the objects which are to be conveyed, the initial-contact point (B) and the end-contact point (C) being offset in the conveying direction by the height of one vertical step ($\Delta h$), and means for removing the carriers from the furnace region, wherein the furnace region is arranged vertically, and wherein the conveying apparatus conveys in the vertical conveying direction.

18. The continuous furnace as claimed in claim 17, wherein the at least two conveying beams and the at least two retaining beams being aligned vertically and being arranged on opposite sides of the carriers which pass through the furnace region.

19. The continuous furnace as claimed in claim 17, which comprises at least two conveying apparatuses, and which also comprises a transverse conveying means for transporting the carriers from one conveying apparatus to the adjacent conveying apparatus, two directly adjacent conveying apparatuses conveying in opposite directions.

20. The continuous furnace as claimed in claim 17, wherein the furnace region comprises a plurality of temperature zones.

* * * * *